United States Patent [19]

Anderson

[11] Patent Number: 4,642,734

[45] **Date of Patent: * Feb. 10, 1987**

[54] INTEGRATED CIRCUIT CHIP SWITCH

[75] Inventor: James R. Anderson, Minneapolis, Minn.

[73] Assignee: Research, Incorporated, Eden Prairie, Minn.

[*] Notice: The portion of the term of this patent subsequent to Dec. 13, 2000 has been disclaimed.

[21] Appl. No.: 807,106

[22] Filed: Dec. 9, 1985

Related U.S. Application Data

[63] Continuation of Ser. No. 728,152, Apr. 30, 1985, abandoned, which is a continuation of Ser. No. 505,295, Jun. 17, 1983, abandoned, which is a continuation-in-part of Ser. No. 300,965, Sep. 10, 1981, Pat. No. 4,420,794.

[51] Int. Cl.[4] .......... H05K 5/00

[52] U.S. Cl. .......... 361/380; 361/405; 361/419; 307/10 AT; 70/DIG. 46; 340/825.5

[58] Field of Search .......... 174/52 FP; 361/171, 361/172, 380, 394, 400, 403, 405, 417–419; 307/10 AT; 70/277, DIG. 46; 340/149 R, 149 A, 147 R, 147 LP, 825.31, 825.5; 235/439–443

[56] References Cited

U.S. PATENT DOCUMENTS

| | | | |
|---|---|---|---|
| 3,134,254 | 5/1964 | Richard | 70/277 |
| 3,345,541 | 10/1967 | Cobaugh | 339/17 CF |
| 3,347,072 | 10/1967 | Rose | 70/277 |
| 3,392,588 | 7/1968 | Hedin | 70/277 |
| 3,651,464 | 3/1972 | Hedin | 340/149 R |
| 3,660,831 | 5/1972 | Nicola | 340/274 |
| 3,673,467 | 6/1972 | Eisenreich | 317/134 |
| 3,686,659 | 8/1972 | Bostrom | 340/274 |
| 3,796,921 | 3/1974 | Fischer | 29/837 |
| 3,851,314 | 11/1974 | Hedin | 340/147 |
| 4,095,791 | 6/1978 | Smith | 361/399 |
| 4,149,027 | 4/1979 | Asher | 361/399 |
| 4,232,353 | 11/1981 | Mosciatti | 361/172 |
| 4,297,569 | 10/1981 | Flies | 340/149 R |
| 4,326,125 | 4/1982 | Flies | 361/171 |
| 4,406,508 | 9/1983 | Behzadi | 339/17 CF |

*Primary Examiner*—G. P. Tolin
*Attorney, Agent, or Firm*—Kinney & Lange

[57] ABSTRACT

A key base or carrier permits a user to attach any off-the-shelf integrated circuit chip in dual in-line packages (DIP) thereto to form a switch-like device merely by bending the chip leads around the edges of the carrier. The carrier, with chip attached, is inserted into a housing between the rows of posts of a standard wire wrap socket and is rotated 90° after insertion to wipe the bent chip leads on the socket posts to insure good electrical contact to the posts. The socket portion of the wire wrap socket assembly can then be used to plug in a ribbon cable, fitted with DIP headers (plugs) on each end, to transfer the electrical connections of the chip to the product circuit board. An independent switch, affixed to the wire wrap socket housing and actuated by the chip carrier, after all connections are made, signals the user's circuit that the chip is in place.

5 Claims, 16 Drawing Figures

INTEGRATED CIRCUIT CHIP SWITCH

CROSS REFERENCE TO RELATED APPLICATION

This application is a continuation of copending application Ser. No. 728,152, filed Apr. 30, 1985 for Integrated Circuit Chip Switch, now abandoned, which in turn is a continuation of copending application Ser. No: 505,295, filed June 17, 1983 for Integrated Circuit Chip Switch, now abandoned, which in turn is a continuation-in-part of my previous copending application Ser. No. 300,965, filed Sept. 10, 1981 for INTEGRATED CIRCUIT SWITCH now U.S. Pat. No. 4,420,794.

BACKGROUND OF THE INVENTION

1. Field of the Invention.

The present invention relates to a device for connection of a standard electronic circuit chips or dual in-line package to the posts of a wire wrap socket connected to a circuit board.

2. Description of the Prior Art.

In the prior art, electronic key-like devices used with various security systems have been advanced. The keys for such devices have been molded and include circuits representing personalized codes or information so that when the key is inserted into a mating component the circuit on the key will either complete certain circuitry remote from the key or will identify the key user and will permit the holder of the key to either unlock locks, or to make transactions similar to that done with a credit card.

One such device is sold by Data Key, Inc., 7710 Computer Avenue, Minneapolis, Minnesota and is marketing under the Trademark DATA KEY. The device is shown in U.S. Pat. Nos. 4,297,569 and 4,326,125.

The "key" that is used is a single individual molded key carrying data access information or an individual digital code. The key in one form comprises a random access memory and is inserted into a suitable socket for identification purposes to permit the operator of the key to perform certain tasks. However, the key itself is individually molded with the particular memory circuit encapsulated on the interior of the key. The key receptacle which interfaces with the key is a specially molded and formed housing and includes read/write heads to decode the information on the key directly and transmit that information to remote electronic packages for operation of the remote systems that are coupled to the key receptacle.

The device of U.S. Pat. Nos. 4,297,569 and 4,326,125 does not lend itself to using standard off the shelf chips such as programmable read only memories (PROM) or other integrated circuits, and quickly connect them into logic boards in various electronic devices.

Additionally, various security locking systems utilizing keys that carry electronic components have been advanced. For example, an electronic solid state lock mechanism is shown in U.S. Pat. No. 3,347,072. This device merely has a key that carries battery cells that power a latch release mechanism when properly inserted into its receptacle.

A binary coded electonic lock and key is shown in U.S. Pat. No. 3,392,558, which reissued as U.S. Pat. No. Re. 27,013. This key is an insertable member which establishes a binary code that is recognized by remote circuitry, and if the code on the key is proper the key will permit opening a lock. A resistively-coded security system is shown in U.S. Pat. No. 3,673,467 wherein a security system has a key that has a plurality of electrically resistive elements on it that complete external circuitry when the key is inserted. A reprogrammable electronic identifying security system is shown in U.S. Pat. No. 3,851,314. A key carrying a binary coded circuit also is shown in U.S. Pat. No. 3,651,464. A locking system which responds to a key that carries capacitance or resistance devices is shown in U.S. Pat. No. 3,134,254. An anti-theft device operated by a key is shown in U.S. Pat. No. 3,660,831. The key has electronic contacts wherein the keyhole and key have two positions such that the insertion of the key in a first position actuates the circuitry in a prealarm state so that unauthorized tampering will sound an alarm. Similar electronic locking devices are shown in U.S. Pat. Nos. 3,686,659 and 4,232,353.

Interchangeable modules for electronic games, such as video games, wherein cartridge printed circuit boards are inserted, are shown in U.S. Pat. Nos. 4,095,791 and 4,149,027.

Each of the prior art devices, however, fails to suggest or teach the use of a device which carries standard integrated circuit chips that can be "off the shelf" and which is readily inserted between the spring contacts (socket posts) of a standard wire wrap socket that in turn is remotely connected to a circuit board so that the logic devices or other integrated circuit components needed for operating a particular unit can easily be interchanged, replaced or removed for security.

SUMMARY OF THE INVENTION

The present invention relates to a base or carrier to which a user can attach standard integrated circuit chips for connection to the posts of a wire wrap socket supported in a housing. The socket posts of the standard wire wrap socket in turn are connected to an internal circuit or logic board. The base or carrier permits mounting any desired integrated circuit chip on the base for connection to a wire wrap socket to form an integrated circuit switch.

An access opening for receiving a key, comprising a carrier base and supported chip, is provided on the housing supporting the wire wrap socket. The carrier is inserted, and subsequently rotated to effect the electrical connection. The carrier base can carry a logic circuit, a memory chip of any desired type, or any other integrated circuit, on a chip or dual in-line package (DIP), that activates, programs or controls a remote circuit board of the electronic module.

As shown herein, a modified form of the carrier may include a battery and chip enable components so that the DIP may carry a CMOS static RAM, kept alive by the battery.

The base or carrier preferably will have an exterior platform with grooves or serrations on its edges, which grooves in one embodiment join grooves defined on the lower surface of the platform of the base. Standard chips have rows of leads on the opposite sides thereof. One chip lead is placed in each serration or groove of the platform to keep the contact leads separated. The leads are bent around the platform edges for holding the chip on the base. When the carrier and chip assembly (comprising a key) is inserted into the space between the two rows of socket posts on the wire wrap socket used, the serrations also serve to guide the socket posts to the appropriate chip leads. Upon rotation of the carrier the contact leads of the integrated circuit chip at the edges of the carrier engage the contacts formed by the wire wrap socket posts.

One preferred embodiment shows the base having a platform with a flat surface for mounting the DIP or chip, and which has the serrations or grooves along its opposite edges for receiving the chip leads. The base is wider than the chip body so that the leads of the chip have to extend outwardly, as well as downwardly around the edges of the platform forming part of the base. Thus, the largest radius of rotation of the leads of the chip on the key is always at the portion of the chip lead at the edge of the base.

This same preferred embodiment includes a "flag" or lug on the end of the base opposite from the handle. The flag or lug extend out of the back wall of the wire wrap socket support housing into which the key is inserted for use. The flag serves two functions. It retains the key in the housing after the key has been rotated to connect the chip leads to the socket posts. The flag or lug is aligned with and will actuate a microswitch mounted on the exterior of the back wall of the housing which supports the wire wrap socket. The microswitch is engaged by the flag after the key has been rotated to make electrical contact between the chip contact leads of the key and the posts of the wire wrap socket used with the key, and before, or just as, the key reaches its home or working position.

The microswitch is preferably used to control power for the components connected to the DIP or chip on the base and to interrupt power or the voltage signal whenever the flag is not contacting the switch. This permits a "cold make" and "cold break" of the contact leads of the chip with the wire wrap socket posts.

The carrier may have a removable handle for security purposes. The carrier also may have molded locating tabs for the DIP or chip body for proper location of the DIP on the platform of the carrier.

The base or carrier structure is easily made, and has wide application because it permits the user to select and mount standard off the shelf chips for connection to the wire wrap socket posts in the housing. Also, computer security may be obtained, because a discrete memory chip can be connected into the internal circuit or removed from a computer terminal logic circuit to serve to identify the user, or to complete the internal circuitry for use. The device can be set so that only a person having the proper key can utilize the circuitry.

The key also can be used to implement changes in computer games by attaching different memory chips to separate bases for insertion into the game logic board. Because the key utilizes standard components which are readily available, the costs are kept low and the flexibility and adaptability is greatly increased because of the wide variety of various integrated circuits that can be incorporated into the concept.

DETAILED DESCRIPTION OF THE PREFERRED EMBODIMENT

Figure 1:
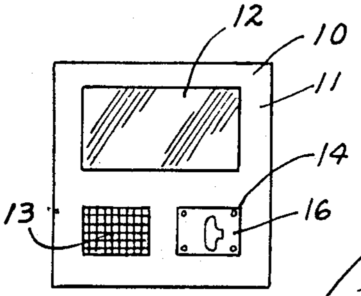
FIG. 1 is a view of a typical electronic unit having an integrated circuit switch made according to the present invention installed therein.

An electronic component indicated at 10 such as a microprocessor, a data processing peripheral, a terminal or a video game, for example, has an outer cabinet 11. A CRT display 12 and various controls 13 are illustrated by way of example. Additionally, the electronic component 10 includes an integrated circuit switch assembly 16 made according to the present invention including a housing having an external mounting flange 14 with a key slot 15 opening to the exterior of the housing 11 in a desired location. The key slot 15 is used with the electronic switch of the present invention.

Figure 2:
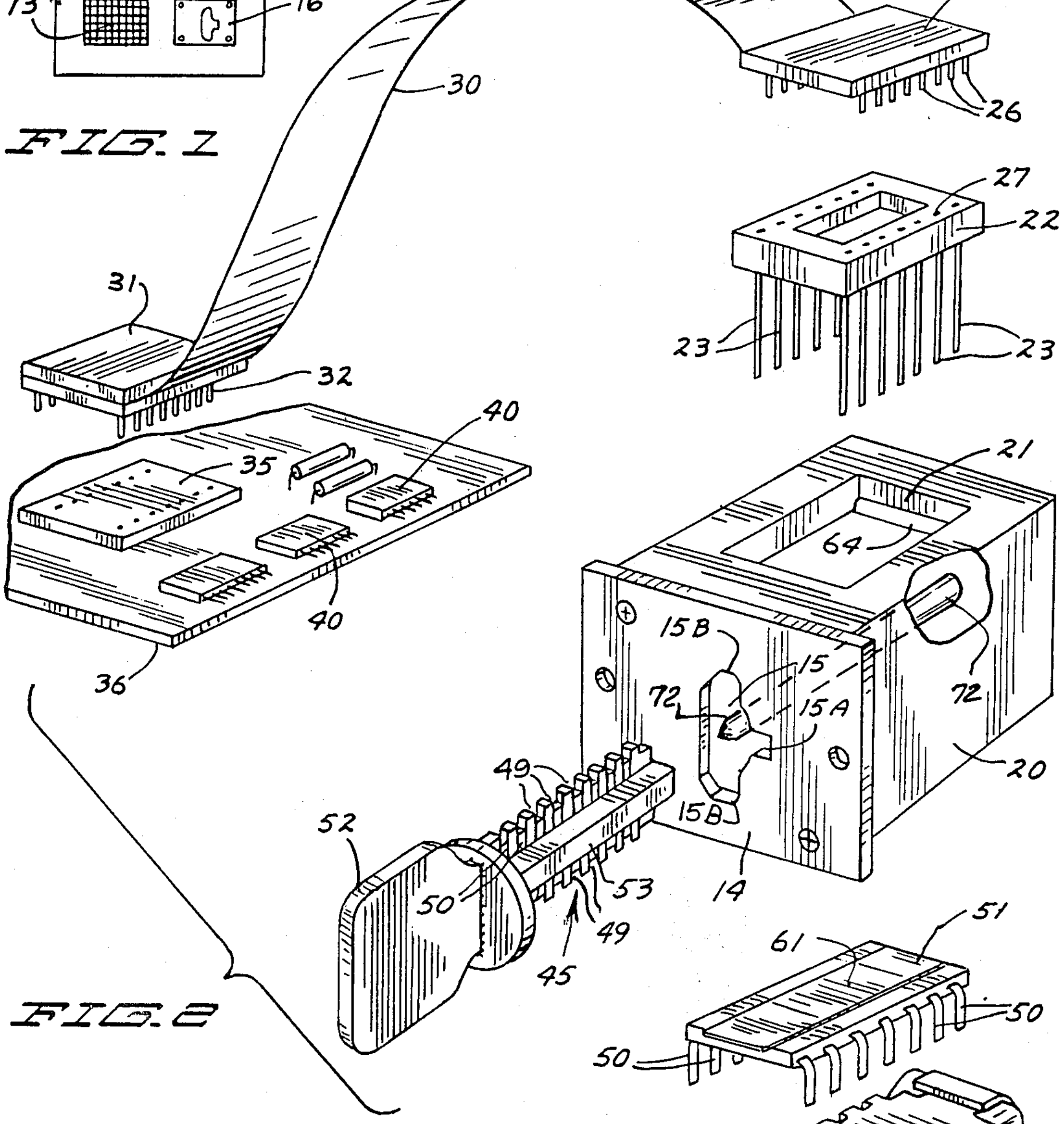
FIG. 2 is an exploded view illustrating the preferred components utilized in operation of the integrated circuit switch of the present invention.
Figure 3:
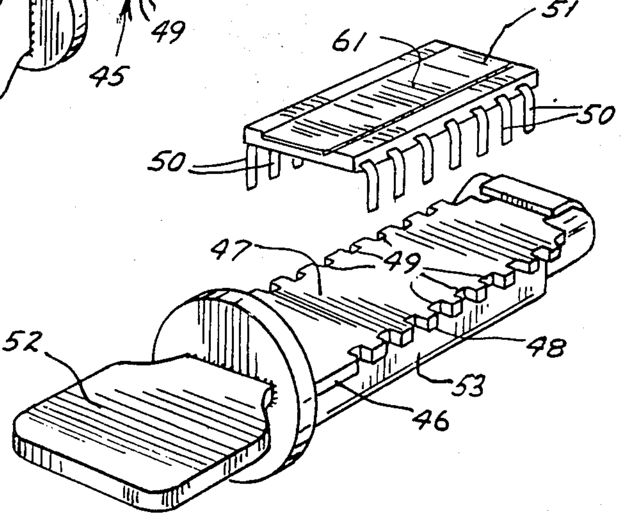
FIG. 3 is an exploded view of a typical key assembly utilized with the integrated circuit switch of the present invention.

Referring to FIG. 2 for example the mounting flange 14 is connected to a housing 20 which includes a receptacle 21 on one side that is adapted to receive a wire wrap socket 22 of conventional design. The socket 22 as shown has a plurality of spring contactors or leads 23 (called socket posts) in rows on opposite sides thereof, which extend from the socket 22 into the interior of the housing.

The wire wrap socket 22 in turn has a plurality of receptacles on the top to receive a mating connector 25. The connector 25 has depending connecting pins 26 that fit into receptacles 27 in the top of the socket. Each of the pins 26, when inserted into a mating receptacle 27 is electrically connected to a corresponding one of the posts 23. Each of the pins 26 also connects to an individual wire in a ribbon cable 30, comprising a jumper cable, that has another plug or connector 31 at the opposite end thereof having pins 32. Each of the pins 32 is connected to a corresponding pin 26. The plug or connector 31 fits into a socket 35 which is part of a circuit mounted on a circuit board 36. The socket 35 in turn has individual receptacles for receiving the pins 32 and connecting, therefore, each of the leads or posts 23 to an individual circuit path or connection on the circuit board 36. As shown, the circuit board 36 carries various integrated circuit components 40, and in the example to be discussed comprises a logic board which requires a memory chip, such as a PROM connected to the socket 35 to be operable.

The key slot opening 15 is made of a size and shape to receive an integrated circuit key device or assembly indicated generally at 45. Key 45 in the form shown includes a key base 46 that has a generally planar support platform 47, and narrow edge portions 48 that are serrated with spaced grooves 49. The grooves 49 are of size and spacing so each groove receives a chip contact lead 50 of an integrated circuit chip 51 of conventional design. The integrated circuit chip 51 is a dual in-line package (DIP) of standard design having the desired number of chip contact leads for standard connections in the data processing industry. What is contained on the chip is limited only by the needs of the user. The DIP is generally a flat chip package that rests flat on the planar platform 47. Additionally, the key base 45 includes a handle 52, and a rib 53 that ifts into a portion 15A of the key slot so that the key has a cross sectional profile that is unique to the opening 15. A cylindrical opening 65 is cetered along the longitudinal axis of the key and forms a guide receptacle as will be explained.

Figure 5:
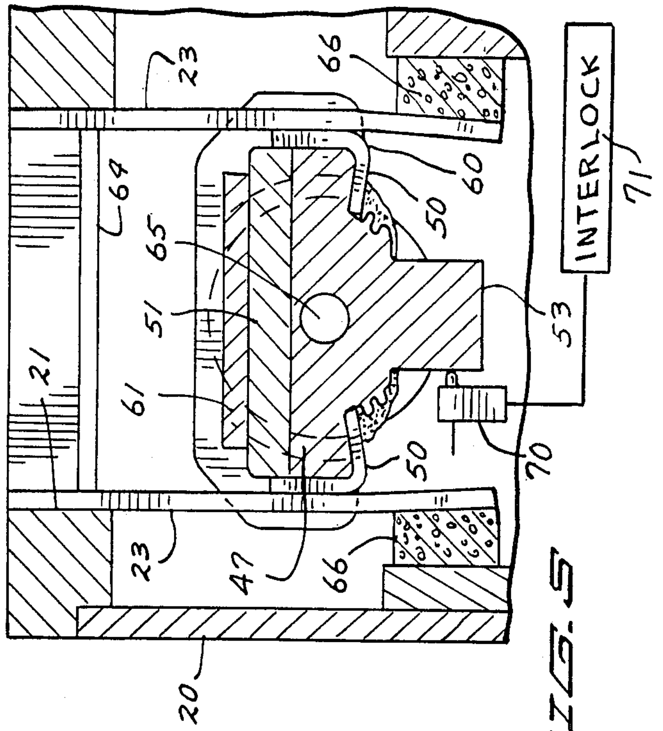
FIG. 5 is a sectional view taken as on line 5—5 in FIG. 4.
Figure 4:
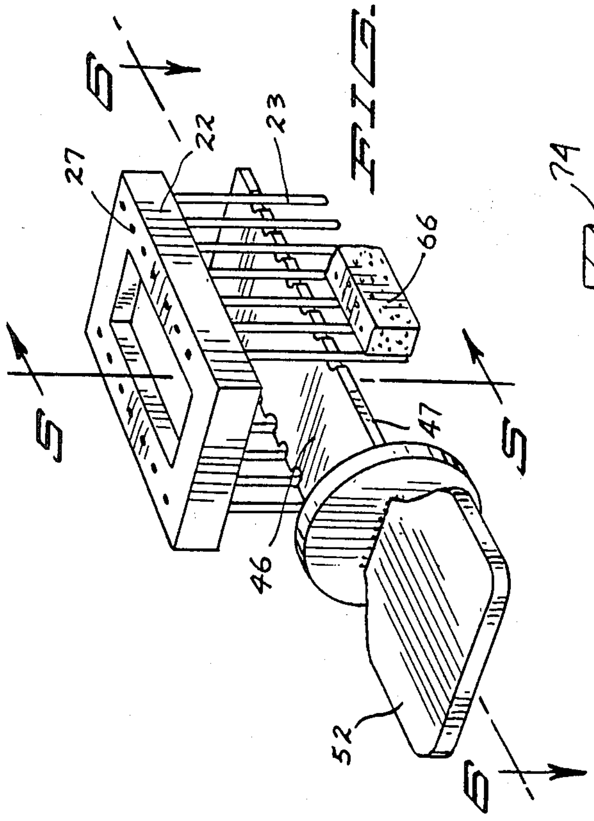
FIG. 4 is a part schematic, perspective view showing the integrated circuit switch key in position in a typical socket used in the assembly.
Figure 6:
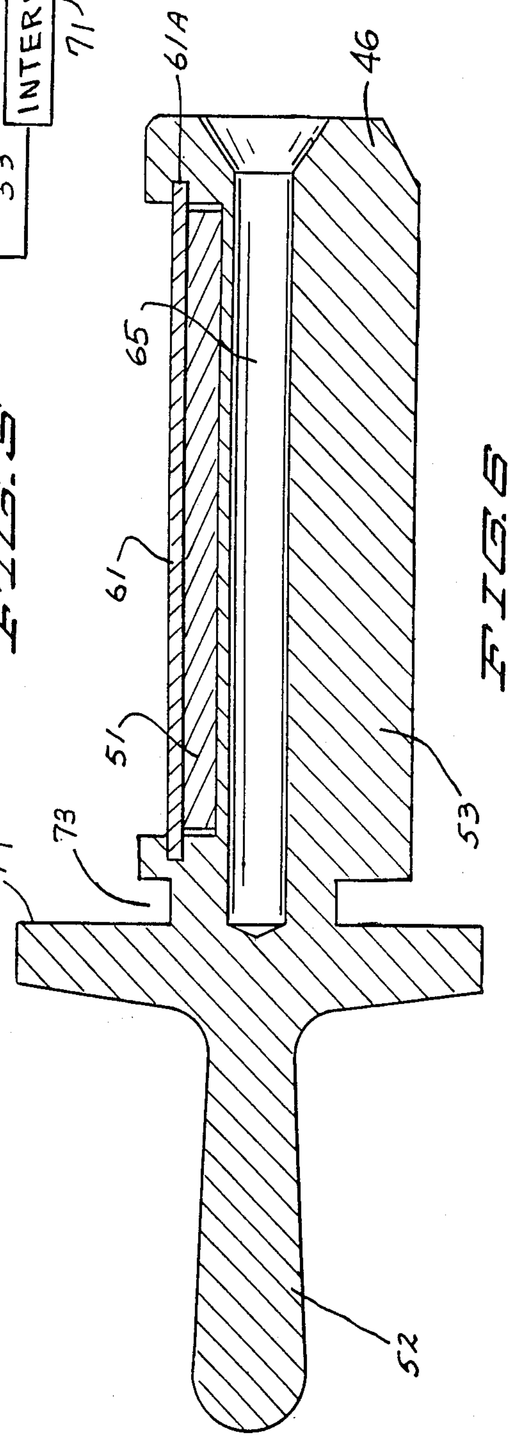
FIG. 6 is a sectional view taken generally along line 6—6 in FIG. 4.

The key base 45 can be made in various ways out of insulating material, but preferably would be injection molded. The flat platform 47 is made so that it will adequately and securely support the base of an integrated circuit chip or DIP 51 and when the base of the DIP is placed into position with each of the chip leads 50 passing through one of the grooves 49, the chip leads 50 can be bent over onto the opposite side of the flat platform 47 as shown in FIG. 5 for example so that the body of the DIP 51 is held tightly against the flat surface of platform 47. Note that the underside surfaces adjacent the edges of the key base, where the chip leads 50 rest, taper back toward the platform 47 slightly to provide a relatively sharp bend of more than 90° at the corner shown at 60 so that the chip leads 50 will take a permanent set and hold the integrated circuit chip tightly against the upper surface of the platform 47. Also, as shown, the ends of the chip leads can be connected to the key base if desired.

The DIP 51 can have a protective cover indicated at 61 placed over it to prevent physical damage when the key (including the DIP) is inserted into the opening 15.

The grooves 49 as shown are spaced an amount corresponding to the standard spacing for chip leads 50, as well as for the socket posts 23 of a standard integrated circuit wire wrap socket 22.

The socket 22, as shown in FIG. 5 is supported in aperture 21 of housing 20 on a suitable support rib 64 at the ends of the aperture, and is held in a suitable manner. For example the socket 22 can be mechanically held in aperture 21 with suitable retainers or may be cemented in place if desired.

The socket posts 23 on opposite sides of the socket 22 depend from the opening 21 in the housing 20. The contacts or socket posts 23 are centered on the central axis of the guide opening 65.

The socket posts 23 extend downwardly in the housing 20 and are retained resiliently from spreading outwardly excessively by suitable resilient pads 66, 66 on opposite sides of the housing. The pads 66 are supported on the housing wall in a suitable manner. The pads 66 form resilient supports for the lower ends of the socket posts 23 so that they will not be bent outwardly excessively when the key assembly is put into use. The pads 66 can be made of a suitable foam material, for example, and should be insulating material that is relatively soft so that the socket posts will be urged inwardly under some low level force to aid in making good contact between socket posts 23 and the chip leads 50 from the integrated circuit.

Once the desired integrated circuit chip has been placed onto a key base 45, and the appropriate accommodations made to connect socket posts 23 to the proper places on the circuit board 40, the key can be inserted into the opening 15 as shown in FIG. 2. As the key is inserted into the housing a guide shaft 72 fits within the opening 65 to support and guide the key properly. As the key is inserted, the plane of the platform extends vertically so the grooves 49 are facing up and down. The edges of platform 47 of the key base are received in a portion of the key opening 15 indicated at 158 while the rib 53 is received in the opening 15A. It can be seen that one of the chip leads 50 is placed in each of the grooves 49 and when the key has been moved into operating position in the opening 15, a groove 73 which forms a cylindrical or annular surface at the base end of the key will align with and receive the flange 14 adjacent to the opening 15. The key locating surface 74 rests on the outer surface of flange 14 to insure that the key will be inserted properly to make sure the grooves 49 and chip leads 50 are aligned with the proper socket posts 23. The distance from the outer surface of the flange to the socket posts is precise and the surface 74 also can be precisely located with respect to the grooves 49 on the key base. The groove 73 closely fits over the flange 14 for proper location as the key is rotated. Thus the key is accurately located in housing 20 in direction along its longitudinal axis.

When the groove 73 is seated on flange 14 the key will be rotated and as this is done, the socket posts 23 (which as shown are the elongated posts of the conventional wire wrap socket) will be properly guided into the grooves 49 on the edges of the key base platform 47 so that the socket posts 23 remain separated. As the key is rotated the portions of chip leads 50 of the integrated circuit on chip 51 that are in the grooves 49 will wipe against the socket posts 23 to assure a good electrical contact between the chip leads 50 and the socket posts 23.

Once the key has been rotated 90° so that electrical connections are made between the chip leads 50 and the socket posts 23, the integrated circuit carried thereon will be connected into the socket 35 and the appropriate circuitry on circuit board 36. The data or components on the integrated circuit chip or DIP 51 will be entered into the circuit for the electronic unit 10 and the unit can be used in a desired manner.

When the unit 10, such as the computer terminal and its associated circuitry, is to be disabled or the programming is to be changed, the key assembly merely is rotated to permit removal of the key assembly and the circuit carried by it. The overall circuit thus has a missing component to prevent its use. If the chip used is a ROM, programming may be changed by removing the old chip from the key base and replacing it with a new ROM having a different program. A second key with a new program also can be used. Further, a PROM chip can be reprogrammed without removing it from the key base or the housing. The cable end 31 can be plugged into a "PROM burner" with the new program loaded in the memory.

In FIG. 5 a microswitch 70 is illustrated as being tripped when the key assembly is in proper position to connect the DIP 51 into the circuit. The microswitch 70 can be used to control an interlock circuit 71 to shut the entire unit down whenever the key is not in place in housing 20. This provides an additional security or safety factor as well as providing a means of activating an alarm to indicate when a key is inserted. Thus for example, if an illegal key was inserted an alarm could be armed by microswitch 70, and only connection of a proper DIP 51 would disable the alarm. If an illegal key was inserted and the incorrect DIP 51 connected, the alarm would activate.

Figure 7:
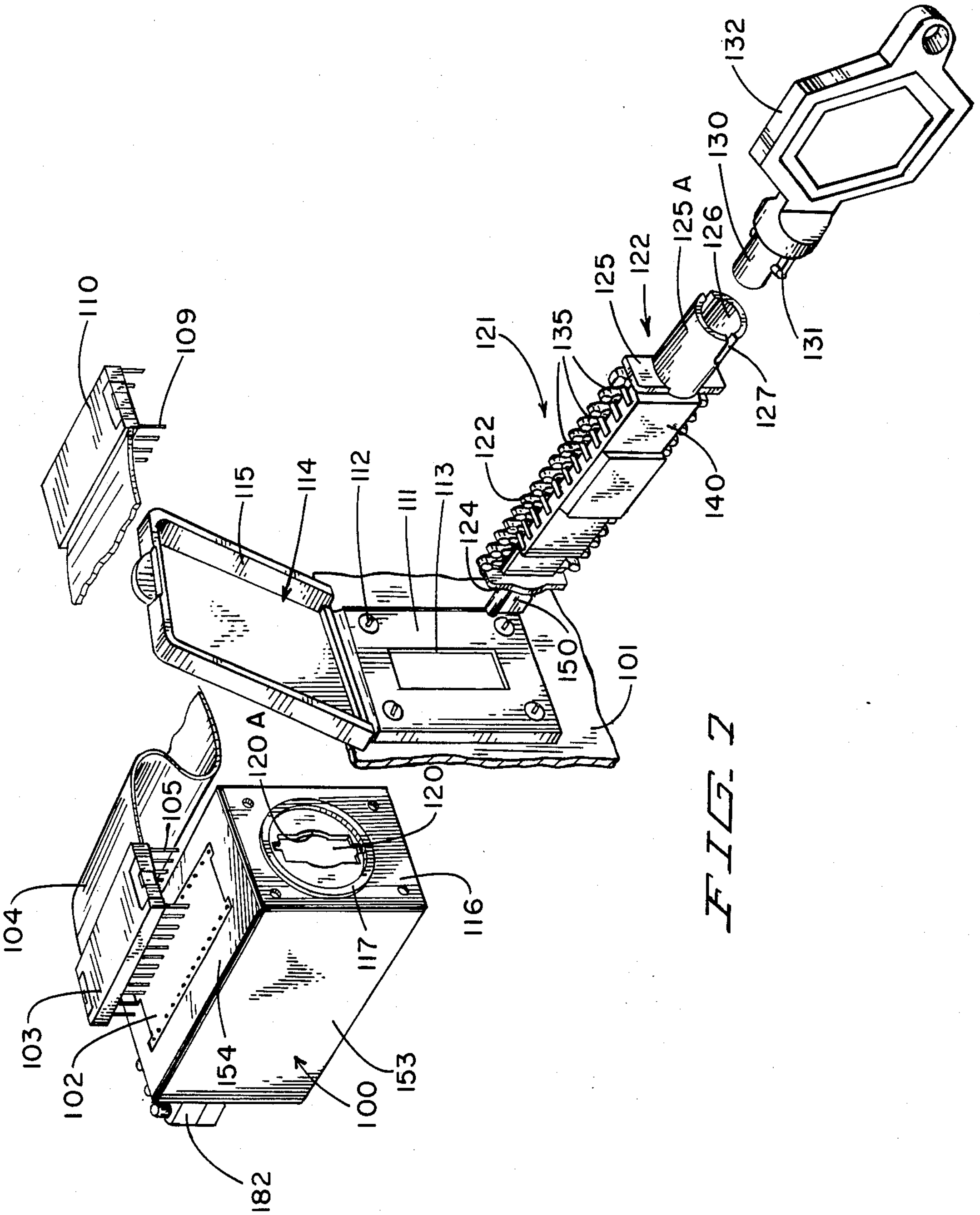
FIG. 7 is an exploded perspective view of a key and housing assembly made according to a second form of the present invention.

Referring to FIG. 7 in particular, a second embodiment of the present invention is illustrated. A housing 100 is adapted to be mounted onto a wall 101 of a suitable cabinet. The housing 100 supports a standard wire wrap socket indicated generally at 102, into which a plug 103 of a ribbon cable 104 can be inserted as previously explained. The plug 103 has two spaced parallel rows of pins 105 which fit into the two spaced, parallel rows of sockets of the standard wire wrap socket 102 mounted on housing 100. The cable 104 has a connector plug 100 at the opposite end with suitable pins 109 for connection into a remote wire wrap socket in a normal manner as previously explained.

The housing 100 is adapted to be mounted on the interior surface of the wall 101, and a bezel 111 is mounted on the exterior of wall 101. Suitable screws 112 pass through the wall 101 and into threaded openings of the housing 100 for fastening the housing and bezel 111 to the wall. The bezel 111 has a rectangular opening 113 in its center portion, and has a cover 114 that is hingedly attached to the bezel with a suitable molded plastic hinge, using known techniques. The cover 114 can be lifted for use, and will hinge down over the bezel to cover the bezel at any time when it is not in use. The cover 114 has peripheral walls 115 as shown that shield the bezel to make the bezel unobtrusive during nonuse. The cover latches closed, using conventional molded plastic snaps or latches.

The housing 100 also has a forward wall 116 with a key opening 120 of an irregular shape aligning with the opening 113. Front wall 116 has an annular rib 117 that forms a pilot rib which fits into a corresponding opening in the wall 101 when the housing 100 is mounted on the wall to properly position the housing. The pilot rib 117 surrounds the key opening 120 in the front wall of the housing 100, and as will be explained, the opening 120 is shaped to receive a key indicated at 121 (key as used herein means a key assembly including base or carrier and a DIP as in the first form of the invention). The opening 113 is large enough so that opening 120 is accessible through the bezel.

Figure 12:
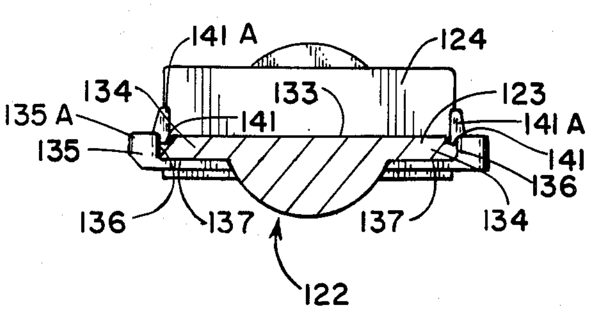
FIG. 12 is a sectional view of a carrier used for the key of the present invention.

As shown, the key 121 includes a molded base or DIP carrier 122 which has a central platform portion indicated 123 (also see FIGS. 8 and 12), a lead end (or insertion end) guide wall 124, and a handle end guide wall 125, both of which are perpendicular to the longitudinal axis of the base or carrier. The walls 124 and 125 are also perpendicular to the support surface of the platform. The longitudinal axis of the carrier 122 is the insertion axis of the key and comprises the axis of rotation of the key when connection is to be made between a DIP and the posts of a wire wrap socket. Additionally, the carrier 122 has a cylindrical hub portion 125A at the handle end which has a socket opening 126. A pair of slots 127 on the hub are made to receive a shank 130 and lock lugs 131 of a key handle 132. The shank 130 is pushed into opening 126 and the lugs 131 snap into place in slots 127 to provide a rotational drive connection from the handle to the base 125. The handle 132 can be removed for security if the key 121 is left in place in the housing during use.

The platform 123, as in the first form of the invention, has a substantially flat upper surface 133 (see FIGS. 8–12). The platform 123 includes edge portions 134 at its side edges on opposite sides of the base or carrier. The edge portions have serrations or grooves indicated at 135 formed by dividers 135A. The edges of the platform are substantially parallel and the slots 135 are spaced along these edges and correspond to the spacing, in longitudinal direction, of the leads from a chip in a standard dual in-line package (DIP) for example as indicated schematically at 140 in FIG. 8, which is to be mounted onto the carrier 122.

Figure 8:
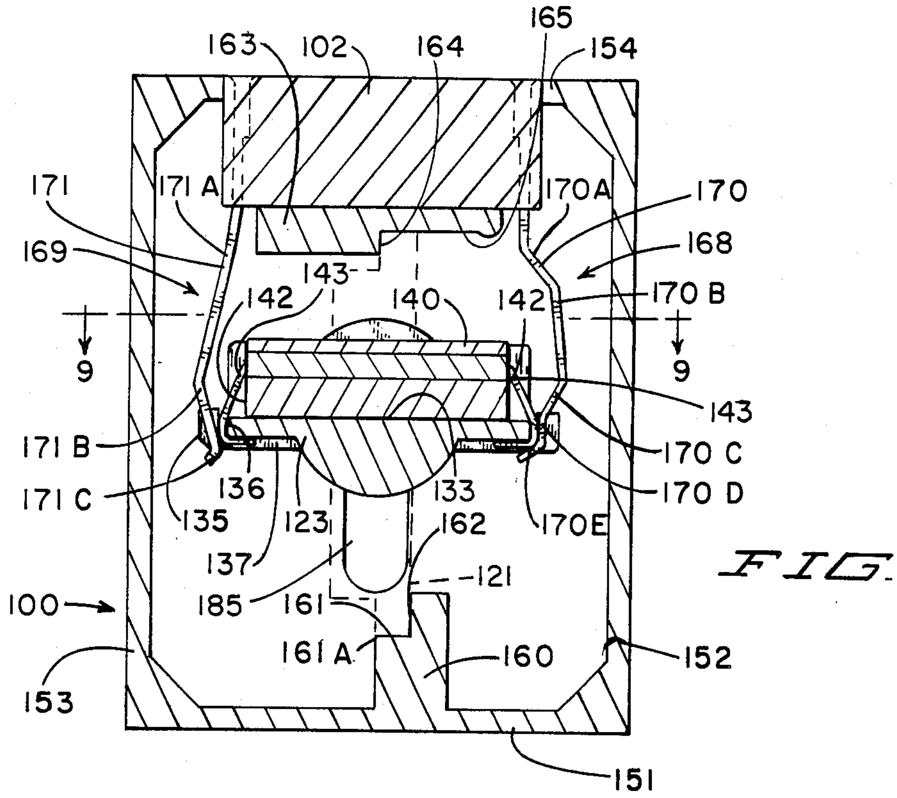
FIG. 8 is a sectional view through the housing of FIG. 7 showing a key in its working position within the housing.
Figure 9:
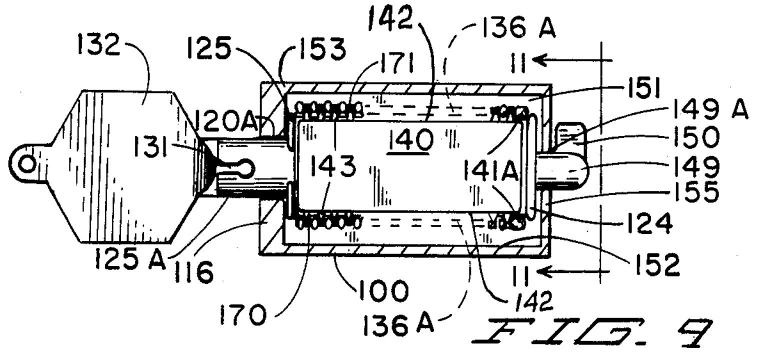
FIG. 9 is a plan view of a key in the housing of FIG. 8 taken on line 9—9 in FIG. 8, but with the housing rotated clockwise 90° from the orientation of FIG. 8.

The standard dual in-line package 140 may be a PROM for example which has a width dimension that is an industry accepted standard for a DIP. This is the lateral dimension from side to side as shown in FIG. 8. The platform 123, from its outer edges where the grooves or serrations 135 are formed is wider than the DIP 140. The grooves 135 terminate at inner end surfaces 136 on opposite sides of the platform. The spacing of the edges 136 is shown by the dotted lines 136A in FIG. 9. The side to side distance on the carrier between surfaces 136 (lines 136A in FIG. 9) between opposite sides of the platform 123 is also greater than the lateral width of the DIP 140. Note that there are small longitudinal grooves 141 in the platform 123 adjacent the edges of the DIP when it is in position on the carrier 122. Locating posts 141A are provided on the corners of the platform 123 to aid in locating the DIP (see FIG. 12). The DIP 140 is thus laterally centered on the platform 123, so that the side edges 142 of the DIP in FIGS. 8 and 9 are spaced inwardly toward the central axis of the carrier 122 from the inner end surfaces 136 forming the inner ends of the serrations or grooves 135. The divider members 135A forming grooves 135 also form grooves 137 on the underside of the side edge portions 134 of platform 123. The grooves 137 are recessed into the platform side edge portions from the undersurface of the side portions 134 a desired amount to provide a recess for receiving the end portions of each of the DIP leads as will be explained.

When a DIP 140 is manufactured, the DIP leads (or elongated contact members) indicated at 143 from the internal circuit components of the standard DIP extend from the DIP 140 generally at right angles to the plane of the DIP body in two parallel rows. The leads 143 are then in a position where they can be inserted in the socket openings or receptacles of a wire wrap socket used for such DIP. The platform 123 is made so that the space between the end surfaces 136 of the grooves on opposite sides of the carrier (represented by the spacing shown by lines 136A in FIG. 9) is greater than the space between the side edges 142 of the DIP. Thus the DIP leads 143 extend laterally outwardly from the edges 142 in order to fit within the grooves or serrations 135 and against the surfaces 136.

In assembly, the parallel rows of DIP leads 143 are formed so the leads "spread eagle" out slightly and the DIP 140 is moved down onto the platform support surface 133. The leads 143 then will be generally extending out from the DIP body at an angle. The leads 143 are then bent around the inner end surfaces 136 of the grooves and up into the grooves 137 on the bottom side of the edge portions 134 of the platform 123 as shown in FIG. 8. The carrier 122 is thus made into a "key" supporting a DIP by bending the end portions of the leads 143 so that the lead ends are recessed into the slots on the undersurface of the edge portions 134 of the platform 123.

The carrier 122 is made to insure that the maximum radius of the chip or DIP leads 143 from the center of rotation of the carrier when used in the housing and when a DIP is mounted on the carrier, is at the end surfaces 136 of each of the serrations or grooves 135. In other words, the radius of the leads 143 is the greatest at the surfaces 136 at the edges of the platform of the carrier and this radius is greater than the radius of any parts of the key which engage the wire wrap socket posts with which the key is used. Of course as this can be seen, the members 135A at the outer edges of the platform 123 extend outwardly from the DIP leads 143, but the members 135A pass between the socket posts when the key is used.

Note also that the outer ends of the members 135A of the edge portions 134 of the platform 123 are rounded so that there is a guiding action for the socket posts as the key is rotated.

Additionally, at the lead end or insertion end of the carrier 123 there is a cylindrical shank or hub 149 that has a "flag" or actuator lug 150. The shank 149 and lug 150 are formed integrally with the carrier. The lug 150 is positioned to be spaced on the shank or hub 149 from the wall 124 as shown in FIG. 9. The use of the flag or actuator lug 150 will be explained subsequently.

Figure 10:
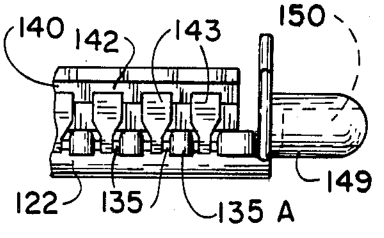
FIG. 10 is a fragmentary side elevational view of one portion of the key of the second form of the invention.
Figure 11:
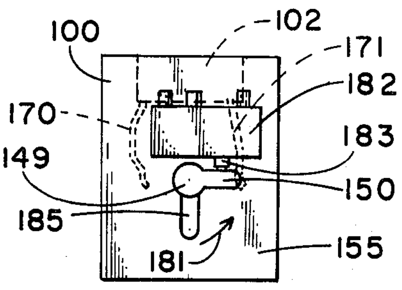
FIG. 11 is a rear end elevational view of the housing shown in FIG. 7 taken on line 11—11 in FIG. 9.

Referring to FIGS. 8, 9 and 10, it can be seen that the housing 100 includes a base or bottom wall 151, a first side wall 152, a second side wall 153, and a top wall 154. Additionally, the housing has the front wall 116, as explained, and a rear wall 155 shown in FIGS. 9 and 11.

As previously explained the housing front wall 116 has an opening 120 of configuration to receive the key 121 with the side edges of the carrier 122 oriented to be extending up and down, or in other words with the plane of the key 121 extending vertically as shown in dotted lines FIG. 8. A longitudinally extending guide 160 is mounted on the bottom wall 151 of the housing 100. The guide 160 extends between the front and rear walls of the housing. Guide 160 has a shoulder indicated at 161 which provides a surface for guiding the edge portions 134 of the platform 123 of the carrier 122 as the key is inserted into housing 100. The very outer edge of the key base or carrier will ride on the upwardly facing surface 161, and a vertical surface indicated at 162 provides a longitudinal guide for the underside of the lower edge portion 134 of the carrier 122. A guide blade 163 is molded to the rear wall 155 of the housing 100 and is spaced from the upper wall of the housing. The guide blade includes a shoulder surface 164 that extends from the rear to the front wall of the housing. The surface 164 is of size to guide the upper edge portion 134 of the platform 123 of a key inserted in the housing, at the very outer edge of the platform. The guide blade has a laterally extending surface 165 at the depth of the surface 164, extending to the right as shown in FIG. 8. The guide blade 163 is positioned just below the wire wrap socket 102 as shown in FIG. 8.

When the key 121 is inserted into the housing 100, the surfaces 161, 162 and 164, 165 guide the edge portions of the key 121. Surfaces 161 and 165 keep the carrier 122 positioned in relation to top and bottom movements and the surfaces 162 and 164 guide the carrier side to side and also prevent counterclockwise rotation of the key. The key 121 is inserted when it is in the dotted line position shown in FIG. 8, rotated 90° counterclockwise from its solid line position shown in FIG. 8.

The wire wrap socket 102 is positioned on support surfaces on the wall 154 in a suitable manner. The socket 102 is a well known standard wire wrap socket and has two spaced parallel rows of socket posts (also called strip contacts), depending therefrom, which are electrically connected to rows of receptacles in the top of the socket. A first row 168 of posts 170 is on one side of the socket, and a second row 169 of posts 171 is on the opposite side of the socket. The rows 168 and 169 are parallel at the bases of the posts where they connect to the socket body, but the posts in one row are not parallel to the individual posts in the other row. The respective posts in each row are evenly spaced along the length of the wire wrap socket.

In this form of the invention, the socket posts 170, 171 are configured to provide aid of operation. There is no keyway inside the housing 100, and the socket posts 170 and 171 depend from the socket body into the open area of the housing. The standard wire wrap socket 102 is longitudinally located on the housing so that the posts will align with the serrations on the platform 123 of the carrier 122 when the lead end guide wall 124 of the carrier is engaging the inner surface of end wall 155 of the housing. The handle end guide wall 125 of the carrier is also then adjacent the inner surface of end wall 116 of the housing. It is when the key 121 is positioned in this axial or longitudinal location that the key can be rotated in the housing. With DIP leads 143 in the serrations or grooves 135, when the carrier 122 is properly inserted into the housing as shown in FIG. 9, each such lead will align with the proper post 170, 171 in the respective rows of posts. Note that the rows 168 and 169 of posts 170, 171 are parallel to the edges 142 of the DIP 140 and straddle guide blade 163.

There are a plurality of the posts 170 in the row 168. The posts 170 are normally perpendicular to the plane of the socket body, but as shown they are formed specifically to aid in making connection between the DIP leads of a DIP on carrier 122 and the socket posts. The socket posts 170 each are bent outwardly near the body of the wire wrap socket 102, along a post section 170A. Each post 170 then has a substantially straight section 170B extending away from the body of socket 102. Another post section 170C bends inwardly toward the center line of socket housing 100 in direction away from the body of socket 102. The posts 170 also have a short substantially vertical or straight section 170D near the tip or outer end and joined to section 170C. The very tip of each post 170 is bent toward the center line of the housing as indicated at 170E in FIG. 8.

The posts 171 of row 168 each have a bent section 171A adjacent the body of socket 102 that extends outwardly from the center line of the socket and the housing. The section 171A is relatively long and a section 171B is bent back in toward the center line of the housing. The bend between post sections 171A and 171B is below the midpoint of the posts 171. The tip of each post 171 is bent back away from the center line of the housing as shown at 171C. The part of each post 171 closest to the center line of the housing is thus upwardly from the lowermost tip of the post. The end sections 171C act as ramp surfaces for spreading the ends of the row of posts 171 when the key 121 is rotated to usable position.

The wire wrap socket posts of standard design are stiff and resilient, and provide a spring load resiliently resisting movement from their rest positions. When the socket posts 170 and 171 are formed as shown in FIG. 8, the lower ends of the posts in both rows are spaced laterally (side to side) from the center plane between the rows of posts a distance less than the radius from the axis of rotation of the key 121 to the end surfaces 136 on the inner ends of the serrations 135 on the carrier 122.

The opening 120 in front wall 116 of the housing 100 has a part cylindrical surface 120A (FIG. 1) generated about a longitudinal axis which forms the rotational axis of the carrier. The rear wall 155 of the housing also has an opening that includes a part cylindrical guide surface coaxial with surface 120A. These part cylindrical guide surfaces form the rotational guide for the key 121 when it is positioned for connection of the DIP carried on the key to the socket 102.

As stated, the leads 143 taper outwardly from the DIP body and are bent around the platform edge portions against surface 136. When the key 121 is inserted and is rotated on the guide surfaces in the end walls of the housing, after it is properly positioned longitudinally, the socket posts must yield to separate before the key is fully seated in its position shown in FIG. 8. This insures a good wiping action, and a good contact between the chip leads and the socket posts. The configuration of the socket posts 171 and in particular section 171B will provide a resilient ramping force tending to continue rotation of the key toward its operable position so that a type of "overcenter" action is felt when the key is rotated to its working location.

Figure 13:
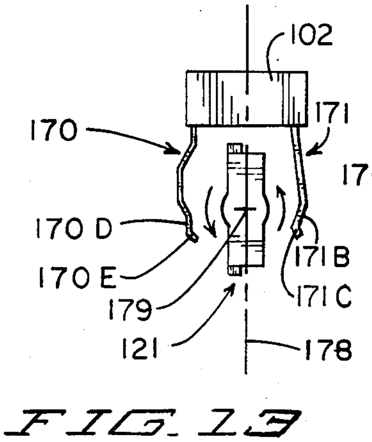
FIGS. 13, 14 and 15 are schematic cross sectional views of a wire wrap socket used in the housing of the second form of the invention showing the key being moved into operable position, as viewed from the rear of the housing of FIG. 7.
Figure 14:
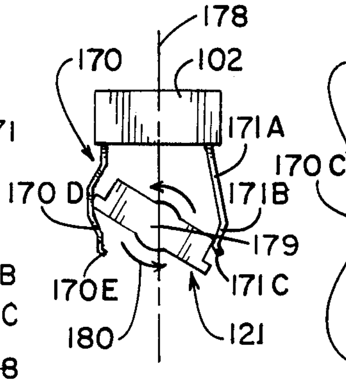
Figure 15:
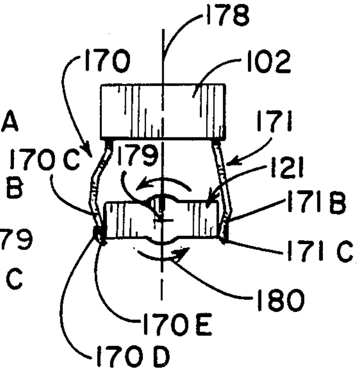

As shown perhaps best schematically in FIGS. 13, 14 and 15, which are taken looking in direction from the rear wall of the housing toward the front wall, the posts 170 and 171 are shown. The posts 171 are on the right hand side of the wire wrap socket 102, and extend downwardly, and the key 121 is shown schematically in position in the housing between the rows of posts of the wire wrap socket. The key 121 is inserted in position shown in FIG. 13 and then is rotated in the direction as indicated by the arrow 180. It can be seen that there is no guiding keyway for the key in the center portions of the housing 100 between the rows 168 and 169 of posts 170 and 171. As the key 121 rotates about axis 179 which is the axis of the openings in the front and rear walls of housing 100 to the position shown in FIG. 14, the posts 170 are starting to move into the serrations or grooves 135 of the carrier 122. The section 171C of the posts 171 will contact the upper surfaces of the chip or DIP leads 143 as the key is turned. Because the lower end sections 171C are tapered outwardly from the center plane 178 perpendicular to the wire wrap socket and midway between the rows 168 and 169 of posts, the posts 171 will be urged outwardly from the center plane. The other edge of key 121 will be moving against the posts 170 from the top and downwardly and the bends of posts 170 are such that while the posts enter the serrations on the corresponding side of the key, the posts 170 do not necessarily contact the DIP leads on that side of the key initially, but only when the respective edge of the key 121 approaches the post sections 170D.

The key 121 will be rotated past the post sections 171C until the chip leads ride up into the post sections 171B, which taper outwardly. At that time the opposite side of the carrier 122, and the leads 143 held in the serrations on such side, are starting to engage the post section 170D of the posts 170. The key is nearing its home position and the key starts to "ramp" onto the post sections 171C. The posts 171 had been forced outwardly from the center plane of the wire wrap socket and from the axis of rotation as the key was initially rotated and thus are spring loaded to provide a resilient force which tends to cause the key to continue to rotate in the direction indicated by the arrows in FIG. 15. The straight sections 170D of the posts 170, which sections are parallel to the center plane 178 of the wire wrap socket 102, does not exert substantial force opposing this rotation and the key 121 will then be urged to rotate as shown by the arrows in FIG. 15 until the post sections 170E are contacted. Post sections 170E engage the leads 143 on the bottom side of the carrier 122 and act as a home position locater to prevent further rotation of the key.

The key will be resiliently held in this "on" or operable position by the resilient force from the posts 171, specifically by the urging of the post sections 171B. The resilient force provided by post sections 171B provides a tactile feel that the connections are moved "home" and are "made" properly.

The actuator lug or flag 150, as previously explained is positioned on shank 149 to the exterior of the rear wall 155 of the housing 100, when the key is in its position for operation as just described. The rear wall 155, in addition to the part cylindrical opening for shank 149, has a slot 185 connected to the cylindrical opening which permits the flag or lug 150 to pass outwardly through the wall when the key 121 is inserted in proper orientation between the posts of the socket. A microswitch 182 is mounted on the exterior of rear wall 155 of the housing. The microswitch has an actuator button 183 aligned with the rotational path of the lug 150 and positioned to be contacted by the lug 150 shortly before the key 121 is urged to its "on" or home position as shown in FIG. 15. As the key 121 is urged by the spring loading of posts 171, and specifically the post sections 171B, after contact has been made between the respective posts 170 and 171 and the corresponding leads 143, the flag or lug 150 is urged up against the microswitch button to actuate the microswitch. The wiping action of the posts on the DIP leads is made before the microswitch 182 is actuated. The contact between the wire wrap socket posts and the respective DIP leads 143 is specifically made before the microswitch is actuated.

The microswitch 182 can thus be connected to provide the power to the circuit that is connected by leads 143 for the components in the standard DIP 140, and there is a "cold make" for the DIP circuit in that the leads 143 will be connected into components through the socket receptacles of wire wrap socket 102 and DIP header 103 and through cable 104 before the DIP circuit is powered. Likewise, when the key 121 is rotated in opposite direction, the flag or lug 150 will open the microswitch 182, and turn off power, before contact is broken between the leads 143 and the aligning ones of the socket posts 170 and 171. Note that with the present switch the receptacles of the wire wrap socket remain available for use.

Figure 16:
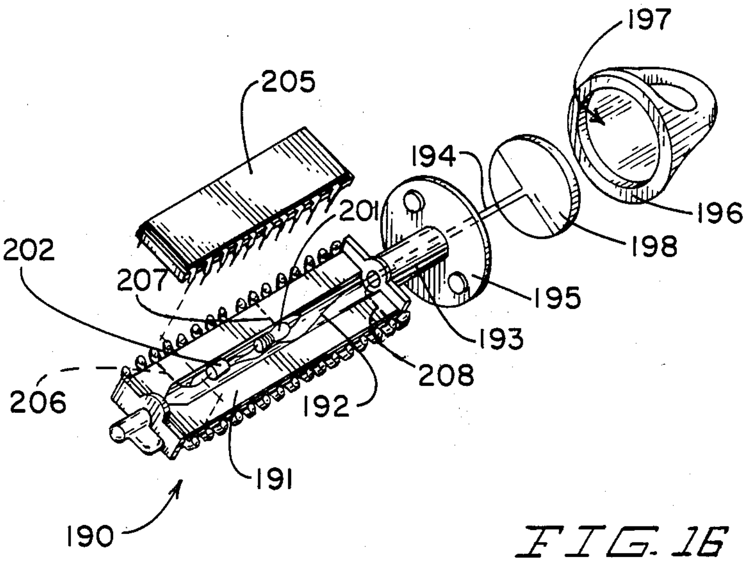
FIG. 16 is a perspective view of a further modified embodiment of a key made according to the present invention with parts broken away.

In FIG. 16, a further modified form of the invention is shown, and this includes a key 190 which has a base or carrier 191 made as described previously, but the carrier 191 has a hollow channel 192 formed therein and has a shank or hub 193 that has an opening through which electrical leads indicated at 194 can pass. The shank 193 in turn is connected to a flange 195 which mates with a handle member 196. The handle member may be fixed to the flange with screws, for example. The flange 195 covers or encloses a receptacle indicated at 197 in the handle. A battery 198 (preferably a lithium battery) is made so that it will fit in the receptacle 197 and the handle 196 is fastened to base 195 with the battery in place. Leads 194 will carry electrical power through a central opening in the shank 193 into the channel 192, where very small components, for example a chip "enable resistor" indicated at 201 and a protection diode 202 can be positioned. The chip enable resistor 201 and diode 202 can be used in connection with a CMOS static RAM (random access memory) DIP indicated at 205 that is mounted onto the carrier with the leads from the DIP 205 extending into serrations on the carrier edges in the manner previously described.

The diode has a lead 206 extending to one of the serrations for connection to a supply voltage (Vcc) lead of the DIP 205. A lead shown in dotted lines 207 from the enable resistor 201 may be exposed at the base of a proper one of the serrations on the sides of the carrier so it will connect to a chip enable lead of the DIP 205 when the DIP is positioned on the carrier. Thus, the DIP 205 may be correctly connected to a battery, such as a lithium battery 198 through the resistor and diode and the negative battery lead shown at 208.

The memory stored in a self-powered RAM can be kept alive by the battery 198 on the carrier. This permits the RAM to be utilized on the carrier because when the key is removed, the data stored in the memory will not be lost.

The spreading of the DIP leads to fit on the platform of the carrier provides for a longer time of contact during key rotation because the leads wipe more against the socket posts.

The RAM key provides read-write capability. The key can be inserted into a socket without any data in its memory and the memory may be loaded with data much like a floppy disc. The key then can be removed and because the data stored in the RAM memory will be retained, the key and the data it has stored may be used at a later time or with another deivce. The RAM key provides the benefits of a floppy disc with the capability of both reading and writing stored data. A lithium battery will typically provide energy to store the date on the DIP for two to three years.

If the key including the assembly circuit on DIP 51 in the first form of the invention is used for identification purposes, the circuit on DIP 51 can be programmed to give a discrete readout of information that identifies the holder of the key. The circuit on the DIP 51 can also be programmed so that it will activate a display on the CRT 12 that gives the holder of a key information that is needed for the operation desired.

Thus, the device of the present invention provides for low cost, rapidly changeable programming for accomplishing all of the purposes of the prior art in a much simplier, more direct, and more readily accessible manner.

The flat platform of the key base or carrier and the overhanging platform edges permit easily fastening the leads of a DIP circuit by bending the connections over the edges in serration or grooves. The grooves in the edges of the carrier also properly locate the circuit on the carrier.

The DIP can also be an electrical alterable read only memory (EAROM). The EAROM can receive its program from the associated circuit board circuitry and the memory in the EAROM "saved" electrically before the key is removed from the housing. The program on the EAROM cannot then be duplicated by another user, and the involved unit will be operable only with the one key.

What is claimed is:

1. A carrier for use in combination with a dual in-line package having a plurality of spaced apart leads on opposite sides thereof, the carrier and dual in-line package combination being usable for connection to a wire wrap socket supportable in a housing and having a plurality of electric contact posts depending therefrom corresponding to the leads on the dual in-line package, said carrier comprising a base having a generally planar exterior surface defined by a platform having spaced edge portions with edge surfaces, a plurality of grooves defined in each of the edge portions, said grooves being defined inwardly from the edge surfaces a desired amount and spaced from adjacent grooves a distance corresponding to the spacing of the leads of a dual in-line package to be supported on the base, said base including a center portion having means for supporting the base for rotation about a central longitudinal rotational axis to permit rotating the base about the axis to move the edge portions in an arc as the base is rotated, said center portion including a cylindrical hub at one end, said dual in-line package having a plurality of chip leads on opposite edges thereof being mounted on said planar exterior surface with each of the leads thereof in one of the grooves on the base and bent over the edge portions to retain such dual in-line package supported on the exterior of the planar exterior surface with the chip leads exposed on the exterior of the base, said hub having a socket opening therein extending inwardly in a direction parallel to the central rotational axis, and a key handle having a shank slidably received in the socket opening and means for releasably connecting the shank of said key handle to said hub and for permitting removal of the key handle in a direction generally parallel to the central rotational axis.

2. A carrier and dual in-line package used in connection with a wire wrap socket having a plurality of electric contact posts depending therefrom and supportable in a housing, said carrier comprising a base having a generally planar exterior surface defined by a platform having spaced edge portions with edge surfaces, a plurality of grooves defined in each of the edge portions, said grooves being defined inwardly from the edge surfaces a desired amount and spaced from adjacent grooves a distance corresponding to the spacing of the leads of said dual in-line package, said base including a center portion having means for supporting the base for rotation about a central longitudinal rotational axis, to permit rotating the base about the axis to move the edge portions in an arc as the base is rotated, said dual in-line package having a plurality of chip leads on opposite edges thereof being mounted on said planar exterior surface with each of the leads thereof in one of the grooves on the base and bent over the edge portions to retain such dual in-line package supported on the exterior of the planar exterior surface with the chip leads exposed on the exterior of the base, said carrier having a handle member removably attached to the base, means for mounting a battery on said removable handle member, said base having a recess formed therein, circuit component means usable with the dual in-line package mounted in the recess, and first means coupled between the handle and the circuit component means for connecting the circuit component means with a battery in the handle when the handle is attached to the base, and second means for coupling the circuit component means with selected leads of the dual in-line package supported on said base, said first means being disconnectable when the handle is removed from the base.

3. An apparatus comprising a carrier, a dual in-line package mounted in the carrier, a wire wrap socket having a plurality of electric contact posts depending therefrom, a housing supporting said wire wrap socket, said carrier and dual in-line package being used in connection with the wire wrap socket, said carrier comprising a base having a generally planar exterior surface defined by a platform having spaced edge portions with edge surfaces, a plurality of grooves defined in each of the edge portions, said grooves being defined inwardly from the edge surfaces a desired amount and spaced from adjacent grooves a distance corresponding to the spacing of the leads of said dual in-line package, said base including a center portion having means for supporting the base for rotation about a central longitudinal rotational axis, to permit rotating the base about the axis to move the edge portions in an arc as the base is rotated, said dual in-line package having a plurality of chip leads on opposite edges thereof and being mounted on said planar exterior surface with each of the leads thereof in one of the grooves on the base and bent over the edge portions to retain such dual in-line package supported on the exterior of the planar exterior surface with the chip leads exposed on the exterior of the base, the platform having a handle connected thereto at one end thereof, said housing having surface means for supporting the base for rotation, and a battery mounted in the handle, said base having a recess formed therein, circuit component means mounted in the recess and coupled in circuit with the battery in the handle and with selected leads of the dual in-line package supported on said base.

4. The carrier of claim 3 wherein said battery is a lithium battery, the circuit component means comprising diode means for insuring unidirectional current flow relative to the battery.

5. The combination of claim 3 wherein said dual in-line package comprises a RAM circuit powered by said battery.

* * * * *